United States Patent
Garcia et al.

(10) Patent No.: US 12,494,768 B2
(45) Date of Patent: Dec. 9, 2025

(54) TRANSVERSELY-EXCITED FILM BULK ACOUSTIC RESONATORS WITH GAP DIELECTRIC STRIPES IN BUSBAR-ELECTRODE GAPS

(71) Applicant: Murata Manufacturing Co., Ltd., Nagaokakyo (JP)

(72) Inventors: Bryant Garcia, Burlingame, CA (US); John Koulakis, Los Angeles, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 74 days.

(21) Appl. No.: 18/065,830

(22) Filed: Dec. 14, 2022

(65) Prior Publication Data

US 2023/0208393 A1    Jun. 29, 2023

Related U.S. Application Data

(60) Provisional application No. 63/294,245, filed on Dec. 28, 2021.

(51) Int. Cl.
    *H03H 9/17*   (2006.01)
    *H03H 3/02*   (2006.01)
    (Continued)

(52) U.S. Cl.
    CPC .............. *H03H 9/173* (2013.01); *H03H 3/02* (2013.01); *H03H 9/02062* (2013.01);
    (Continued)

(58) Field of Classification Search
    CPC ...... H03H 9/173; H03H 3/02; H03H 9/02062; H03H 9/02086; H03H 9/133; H03H 9/56;
    (Continued)

(56) References Cited

U.S. PATENT DOCUMENTS

| | | | | |
|---|---|---|---|---|
| 3,816,753 A | * | 6/1974 | Kino | ...................... G06G 7/195 |
| | | | | 365/45 |
| 3,955,159 A | * | 5/1976 | Mitchell | ............ H03H 9/14547 |
| | | | | 333/151 |

(Continued)

FOREIGN PATENT DOCUMENTS

| WO | 2016017104 | | 2/2016 |
|---|---|---|---|
| WO | 2018003273 | A1 | 1/2018 |
| WO | 2023002858 | A1 | 1/2023 |

OTHER PUBLICATIONS

International Search Report and Written Opinion in PCT/US2022/082421, mailed May 3, 2023, 16 pages.

(Continued)

*Primary Examiner* — Andrea Lindgren Baltzell
*Assistant Examiner* — Kimberly E Glenn
(74) *Attorney, Agent, or Firm* — ArentFox Schiff LLP

(57) ABSTRACT

An acoustic resonator device includes a substrate having a surface and a piezoelectric plate having front and back surfaces, with the back surface attached to the surface of the substrate except for a portion of the piezoelectric plate forming a diaphragm that spans a cavity in the substrate. An interdigital transducer (IDT) is formed on the front surface of the piezoelectric plate such that interleaved fingers of the IDT are disposed on the diaphragm. Stripes of a dielectric material formed over the plate in gaps between ends of the interleaved fingers and opposing busbars of the IDT.

20 Claims, 13 Drawing Sheets

(51) Int. Cl.
*H03H 9/02* (2006.01)
*H03H 9/13* (2006.01)
*H03H 9/56* (2006.01)

(52) U.S. Cl.
CPC ........ *H03H 9/02086* (2013.01); *H03H 9/133* (2013.01); *H03H 9/56* (2013.01); *H03H 2003/021* (2013.01); *H03H 9/02031* (2013.01)

(58) Field of Classification Search
CPC ......... H03H 9/02031; H03H 2003/021; H03H 2003/023; H03H 9/02228; H03H 9/02015; H03H 9/564; H03H 9/582
See application file for complete search history.

(56) References Cited

U.S. PATENT DOCUMENTS

| | | | |
|---|---|---|---|
| 5,705,399 A | 1/1998 | Larue | |
| 5,773,911 A * | 6/1998 | Tanaka | H03H 9/14505 333/194 |
| 5,853,601 A | 12/1998 | Krishaswamy et al. | |
| 6,540,827 B1 | 4/2003 | Levy et al. | |
| 6,707,229 B1 | 3/2004 | Martin | |
| 7,463,118 B2 | 12/2008 | Jacobsen | |
| 7,535,152 B2 | 5/2009 | Ogami et al. | |
| 7,573,178 B2 * | 8/2009 | Inoue | H03H 9/02574 310/313 R |
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,058,768 B2 * | 11/2011 | Milsom | H03H 9/175 310/313 R |
| 8,085,117 B1 * | 12/2011 | Abbott | H03H 9/0222 310/313 R |
| 8,278,802 B1 | 10/2012 | Lee et al. | |
| 8,344,815 B2 | 1/2013 | Yamanaka | |
| 8,829,766 B2 | 9/2014 | Milyutin et al. | |
| 8,932,686 B2 | 1/2015 | Hayakawa et al. | |
| 9,048,813 B2 * | 6/2015 | Iwasaki | H03H 3/10 |
| 9,130,145 B2 | 9/2015 | Martin et al. | |
| 9,136,458 B2 * | 9/2015 | Komatsu | H10N 30/87 |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 | 8/2017 | Kando et al. | |
| 9,780,759 B2 | 10/2017 | Kimura et al. | |
| 10,200,013 B2 | 2/2019 | Bower et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 | 11/2020 | Plesski et al. | |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0261250 A1 | 12/2004 | Kadota et al. | |
| 2006/0125489 A1 | 6/2006 | Feucht et al. | |
| 2006/0222568 A1 | 10/2006 | Wang et al. | |
| 2007/0194863 A1 | 8/2007 | Shibata et al. | |
| 2010/0064492 A1 | 3/2010 | Tanaka | |
| 2010/0123367 A1 | 5/2010 | Tai et al. | |
| 2011/0109196 A1 | 5/2011 | Goto | |
| 2011/0278993 A1 | 11/2011 | Iwamoto | |
| 2013/0015353 A1 | 1/2013 | Tai et al. | |
| 2013/0234805 A1 | 9/2013 | Takahashi | |
| 2013/0321100 A1 | 12/2013 | Wang | |
| 2014/0001919 A1 | 1/2014 | Komatsu et al. | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0170368 A1 | 6/2017 | Iwaki et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2017/0324394 A1 | 11/2017 | Ebner et al. | |
| 2017/0370791 A1 | 12/2017 | Nakamura et al. | |
| 2018/0123016 A1 | 5/2018 | Gong et al. | |
| 2018/0191322 A1 | 7/2018 | Chang et al. | |
| 2019/0068164 A1 | 2/2019 | Houlden et al. | |
| 2019/0131953 A1 | 5/2019 | Gong | |
| 2019/0273480 A1 | 9/2019 | Lin | |
| 2019/0386633 A1 * | 12/2019 | Plesski | H03H 9/54 |
| 2020/0336130 A1 | 10/2020 | Turner | |
| 2022/0231657 A1 * | 7/2022 | McHugh | H03H 9/568 |
| 2024/0154595 A1 | 5/2024 | Daimon | |
| 2024/0154596 A1 | 5/2024 | Daimon | |

OTHER PUBLICATIONS

T. Takai, H. Iwamoto, et al., "I.H.P.Saw Technology and its Application to Microacoustic Components (Invited)." 2017 IEEE International Ultrasonics Symposium, Sept. 6-9, 2017. pp. 1-8.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y—cut X—propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

(56) References Cited

OTHER PUBLICATIONS

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi: 10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

* cited by examiner

TRANSVERSELY-EXCITED FILM BULK ACOUSTIC RESONATORS WITH GAP DIELECTRIC STRIPES IN BUSBAR-ELECTRODE GAPS

CROSS REFERENCE TO RELATED APPLICATIONS

This patent claims priority to U.S. provisional patent application No. 63/294,245, filed Dec. 28, 2021, entitled GAP OXIDE STRIP ACOUSTIC CONFINEMENT STRUCTURES FOR Y-CUT LN, the entire contents of which are hereby incorporated by reference.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP (3$^{rd}$ Generation Partnership Project). Radio access technology for 5$^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XB AR resonator comprises an interdigital transducer (IDT) formed on a thin floating layer, or diaphragm, of or having a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

SUMMARY OF THE INVENTION

In an exemplary aspect, an acoustic resonator device is provided that includes a substrate having a surface; a piezoelectric plate attached to the surface of the substrate except for a portion of the piezoelectric plate forming a diaphragm that spans a cavity in an intermediate dielectric layer of the substrate; an interdigital transducer (IDT) on a surface of the piezoelectric plate such that interleaved fingers of the IDT are disposed on the diaphragm; and a plurality of stripes of a dielectric material formed over the piezoelectric plate in gaps between ends of the interleaved fingers and opposing busbars of the IDT.

In another exemplary aspect, a first plurality of the interleaved fingers is attached to a first busbar that opposes a second plurality of the interleaved fingers; and wherein the second plurality of the interleaved finger In another exemplary aspect, the plurality of stripes includes a first stripe of the dielectric material formed over the plate in but not over the second plurality of the interleaved fingers in a first gap between ends of the first plurality of the interleaved fingers and the second busbar, and a second stripe of the dielectric material formed over the plate in but not over the first plurality of the interleaved fingers in a second gap between ends of the second plurality of the interleaved fingers and the first busbar.

In another exemplary aspect, an overlapping distance of the interleaved fingers defines an aperture of the resonator device, and wherein the plurality of stripes are configured to reduce acoustic energy leakage from the aperture in a transverse direction that is parallel to a length of the interleaved fingers.

In another exemplary aspect, the plurality of stripes of the dielectric material have a width of between 2 um and 5 um; and a thickness of between 10 nm and 50 nm; and wherein the dielectric material is one of SiO2, Si3N4, or AlN.

In another exemplary aspect, the plurality of stripes are each rectangular strip shapes between flat shaped ends of the interleaved fingers and flat shaped inner surfaces of opposing busbars.

In another exemplary aspect, a radio frequency signal applied to the IDT excites a primary shear acoustic mode in the piezoelectric plate over the cavity, and wherein the cavity is formed in the intermediate layer of the substrate.

In another exemplary aspect, the plate is a rotated Y-cut lithium niobate piezoelectric plate and the resonator device is a shunt resonator of a ladder filter.

In another exemplary aspect, the plurality of stripes are configured to lower an amplitude of and a frequency range of output gap mode spurs appearing immediately above the resonant frequency of the resonator.

In another exemplary aspect, the plurality of stripes of the dielectric material are one of located solely within the Busbar-electrode gap or extending over a width of the busbars.

According to an exemplary aspect, an acoustic resonator device is provided that includes a substrate having a surface; a single-crystal piezoelectric plate attached to the surface of the substrate, except for a portion of the piezoelectric plate forming a diaphragm that spans a cavity in an intermediate dielectric layer of the substrate; and a conductor pattern including an interdigital transducer (IDT) is formed on a surface of the single-crystal piezoelectric plate such that interleaved fingers of the IDT are disposed on the diaphragm, wherein the IDT includes a first set of the interleaved fingers attached to and extending from a first busbar, and a second set of the interleaved fingers attached to and extending from a second busbar; and a plurality of stripes of a dielectric material formed over the plate in gaps between ends of the set of first interleaved fingers and inner surfaces of the second busbar, and ends of the set of second interleaved fingers and inner surfaces of the first busbar.

Figure 1:
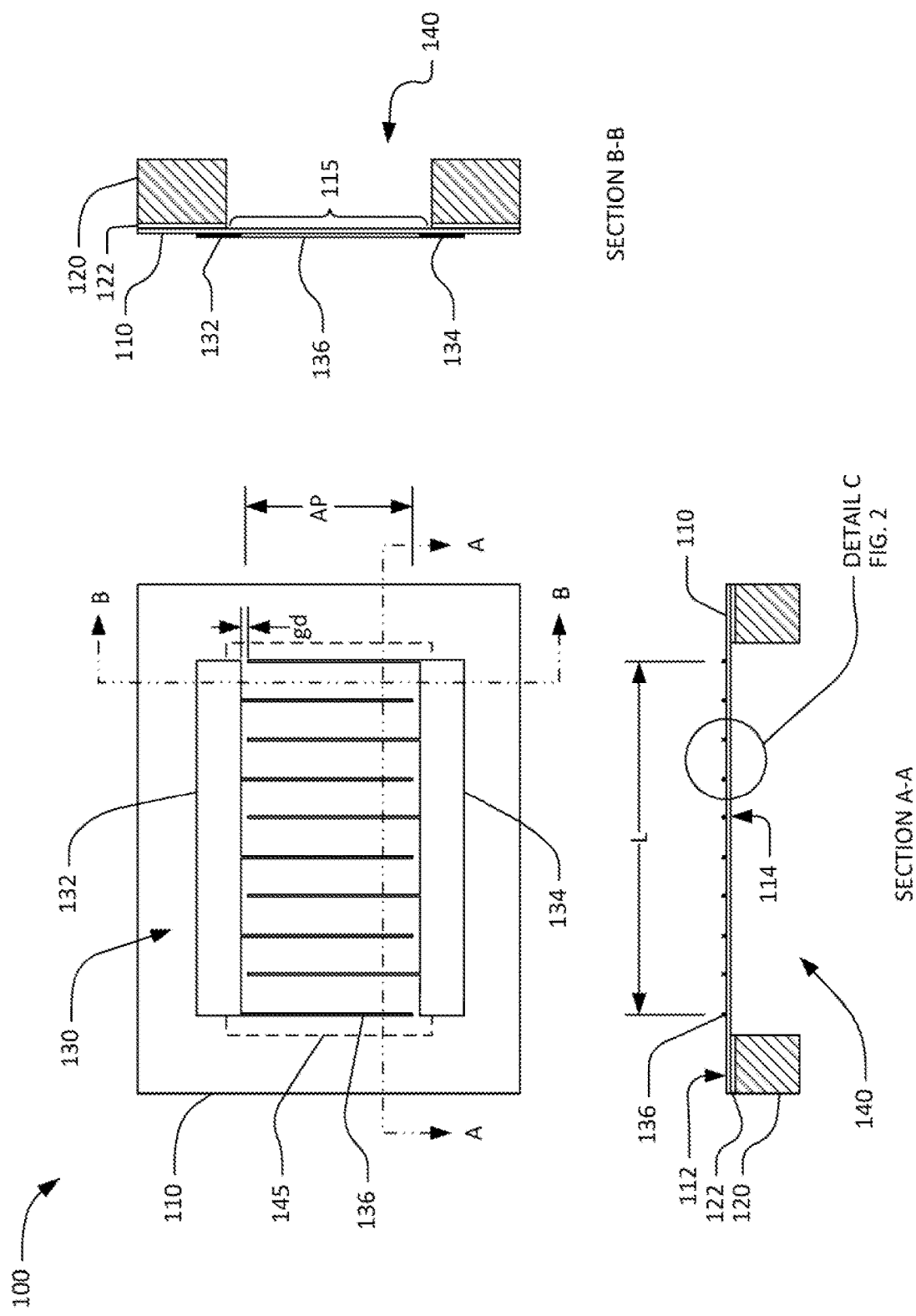
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include front-side and/or back-side dielectric layers. An XB AR resonator may be such a diaphragm or membrane with an interdigital transducer (IDT) formed on a diaphragm or membrane.

Three dimensional simulations of XBAR devices show acoustic energy may leak from the resonator area in the transverse direction (parallel to the IDT fingers). Such leakage may cause undesired ripples in resonator admittance and increase undesired insertion loss for XBAR filters.

The following describes improved XBAR resonators, filters and fabrication techniques for XBAR resonators with gap dielectric stripes in busbar-electrode gaps. The gap dielectric stripes in busbar-electrode gaps may serve two primary purposes: 1) to remove gap mode spurs by moving them lower in frequency and (potentially) reducing their magnitude; and 2) to improve acoustic confinement and limit energy leakage to the busbar region, improving device Q.

The stripes can be structures for confining acoustic energy within the resonator area of a rotated Y-cut lithium niobate piezoelectric plate in order to reduce device losses. Using the gap dielectric stripes (as compared to not having them) can also move problematic 'gap mode' spurs (e.g., gap modes), appearing immediately above the resonant frequency, to a more favorable location in frequency space by lowering the frequency of the 'gap mode' spurs to a frequency of lesser concern for the filter application. In addition to altering their frequency, using gap dielectric strips can also reduce the magnitude of these problematic 'gap mode' spurs.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114 (i.e., first and second surfaces), respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. The plate 110 may be a Y-cut piezoelectric plate (which is to say the Y axis is normal to the front and back surfaces 112, 114), a Y-cut lithium niobate (LN) plate, a Y-cut lithium tantalate plate, a rotated Y-cut LN piezoelectric plate or a 128-Y cut LiNbO3 plate. XBARs may be fabricated on piezoelectric plates with other crystallographic orientations.

The back surface 114 (i.e., second surface) of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide (BOX) layer or an intermediate layer 122, such as a layer of SiO2, or another oxide such as Al2O3.

As shown in FIG. 1, the diaphragm 115 is contiguous with the rest of the piezoelectric plate 110 around all of a perimeter 145 of the cavity 1. In this context, "contiguous" means "continuously connected without any intervening item". It is possible for a bonding oxide layer (BOX) or intermediate layer 122 to bond the plate 110 to the substrate 120. The BOX or layer 122 layer may exist between the plate and substrate around perimeter 145 and may extend further away from the cavity than just within the perimeter itself. In the absence of a process to remove it (i.e., this invention) the BOX or intermediate layer 122 is everywhere between the piezoelectric plate and the substrate. The BOX or intermediate layer 122 may be removed from the back of the diaphragm 115 as part of forming the cavity, such as during or after backside etching the cavity 140 from the back side of the substrate. In some cases, a substrate of a device wafer may include the BOX or intermediate layer 122 and substrate 120.

The conductor pattern of the XBAR 100 includes a conductor patter having an interdigital transducer (IDT) 130 formed on the front surface 112 (i.e., first surface) of the piezoelectric plate 110. However, in an alternative aspect, the IDT 130 can be formed on the back surface 114 (i.e., second surface) and/or both opposing surfaces of the piezoelectric plate 110. In either case, the IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

There are gap distances gd from the tip of the IDT finger ends to the nearest surface of the opposing busbar. Distances gd can be in a range of between 1 and 10 um. The gap distances gd may be in a direction tangential to the tip of the finger end. The gap distances gd may be between 2 and 5 um. The gap distance gd may be the pitch p minus the mark m or width of the fingers.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
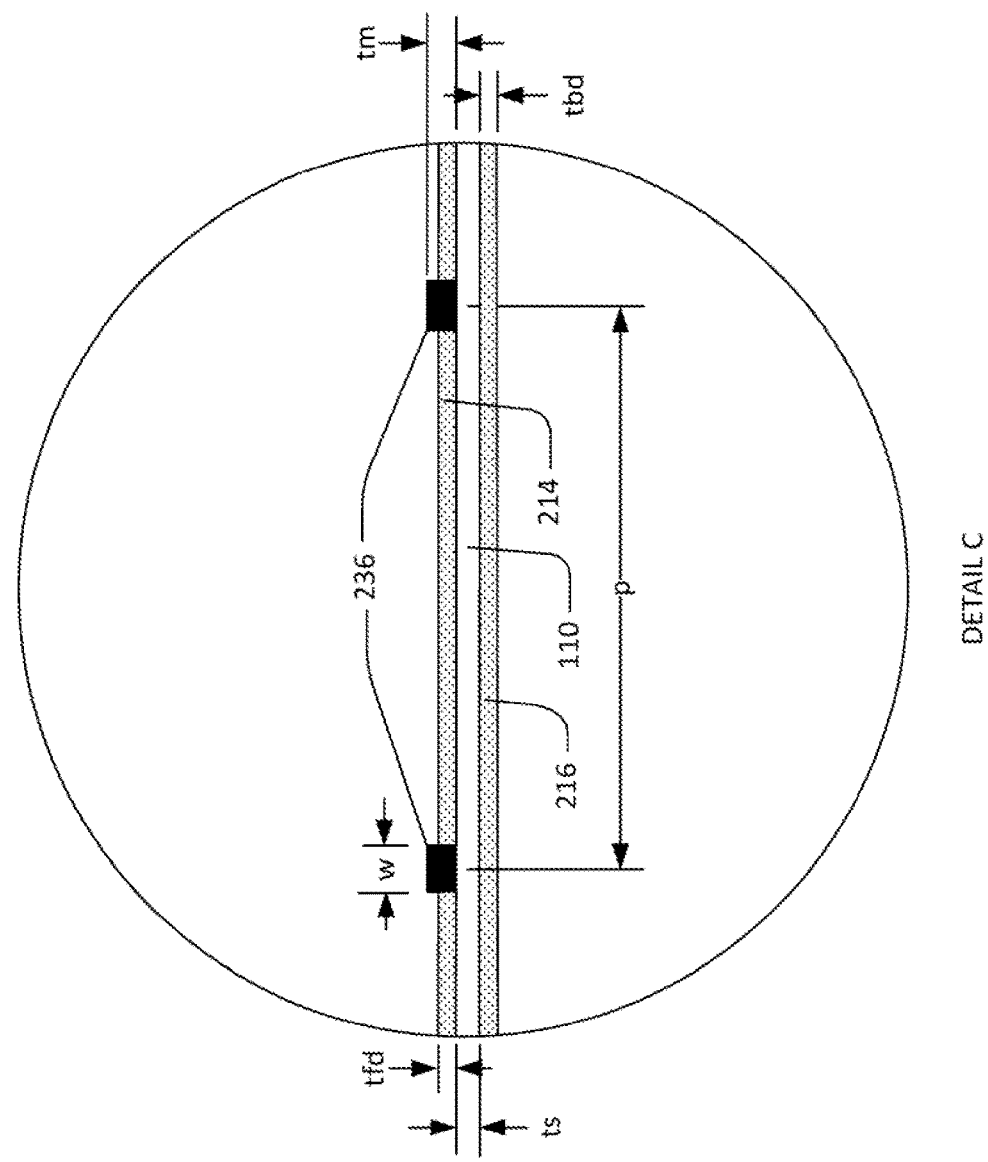
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness is of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuity external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of multiple oxide and/or nitride coatings such as SiO2 and Si3N4 material.

The IDT fingers 238 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. If the center-to-center spacing of the IDT fingers varies along the length of the IDT, the "pitch" is the average of the center-to-center spacing of all pairs of adjacent fingers. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The pitch p may be between 3 um and 8 um. The pitch p may be between 4 um and 5 um. The plate thickness ts may be between 300 nm and 500 nm. The plate thickness ts may be 400 nm. The finger width w may be between 0.5 um and 7.5 um. The finger width w may be 1 um. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
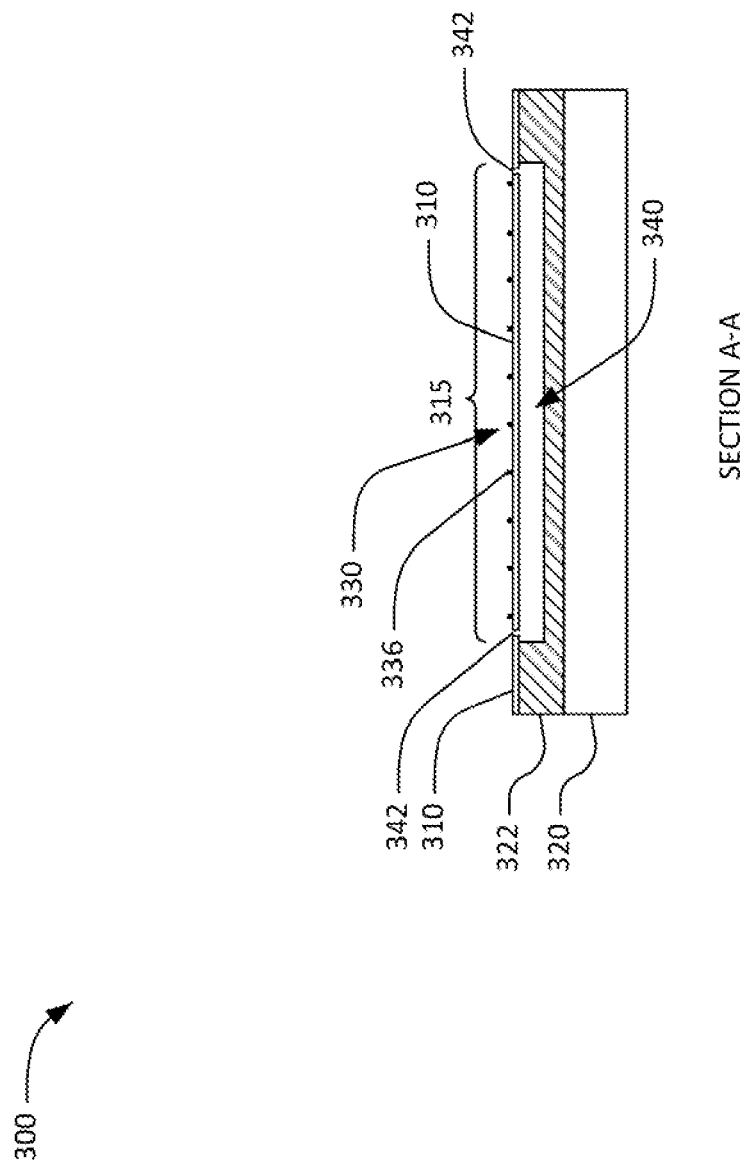
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to an intermediate layer 322 of a substrate 320. A portion of the piezoelectric plate 310 forms a diaphragm 315 spanning a cavity 340 in the substrate. The cavity 340, does not fully penetrate the intermediate layer 322, and is formed in the layer 322 under the portion of the piezoelectric plate 310 containing the IDT 330 of a conductor pattern (e.g., first metal or M1 layer) of an XBAR. Fingers, such as finger 336, of an IDT are disposed on the diaphragm 315. Interconnection of the IDT (e.g., busbars) 330 to signal and ground paths may be through a second conductor pattern (e.g., an M2 metal layer, not shown in FIGS. 1-3A) to other conductor patterns and/or to electrical contacts on a package.

Plate 310, diaphragm 315 and fingers 336 may be plate 110, diaphragm 115 and fingers 136 (or 236). The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

Intermediate layer 322 may be one or more intermediate material layers attached between plate 310 and substrate 320. An intermediary layer may be or include a bonding layer, a BOX layer, an etch stop layer, a sealing layer, an adhesive layer or layer of other material that is attached or bonded to plate 310 and substrate 320. A layer of layers 322 may be a dielectric, an oxide, a silicon oxide, silicon nitride, an aluminum oxide, silicon dioxide or silicon nitride. Layers 322 may be one or more of any of these layers or a combination of these layers.

While the cavity 340 is shown in cross-section, it should be understood that the lateral extent of the cavity is a continuous closed band area of layer 322 that surrounds and defines the size of the cavity 340 in the direction normal to the plane of the drawing. The lateral (i.e. left-right as shown in the figure) extent of the cavity 340 is defined by the lateral edges layer 322. The vertical (i.e. down from plate 310 as shown in the figure) extent or depth of the cavity 340 into layer 322. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the layer 322 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

In some cases, the substrate comprises a base substrate 320 and an intermediate layer (not shown) to reinforce an intermediate bonding oxide (BOX) layer. Here, the first intermediate layer may be considered a part of the substrate base 320.

In some cases, layer 322 does not exist and the plate is bonded directly to the substrate 320; and the cavity is formed in and etched into the substrate 320.

In some cases, although not shown in the figure, layer 322 is a thinner layer than the depth of the cavity such that the plate is bonded directly to layer 322; and the cavity is formed in and etched into the layer 322 and into the substrate 320. Here, the cavity extends completely through layer 322 and has a cavity bottom in the substrate 320.

Figure 3B:
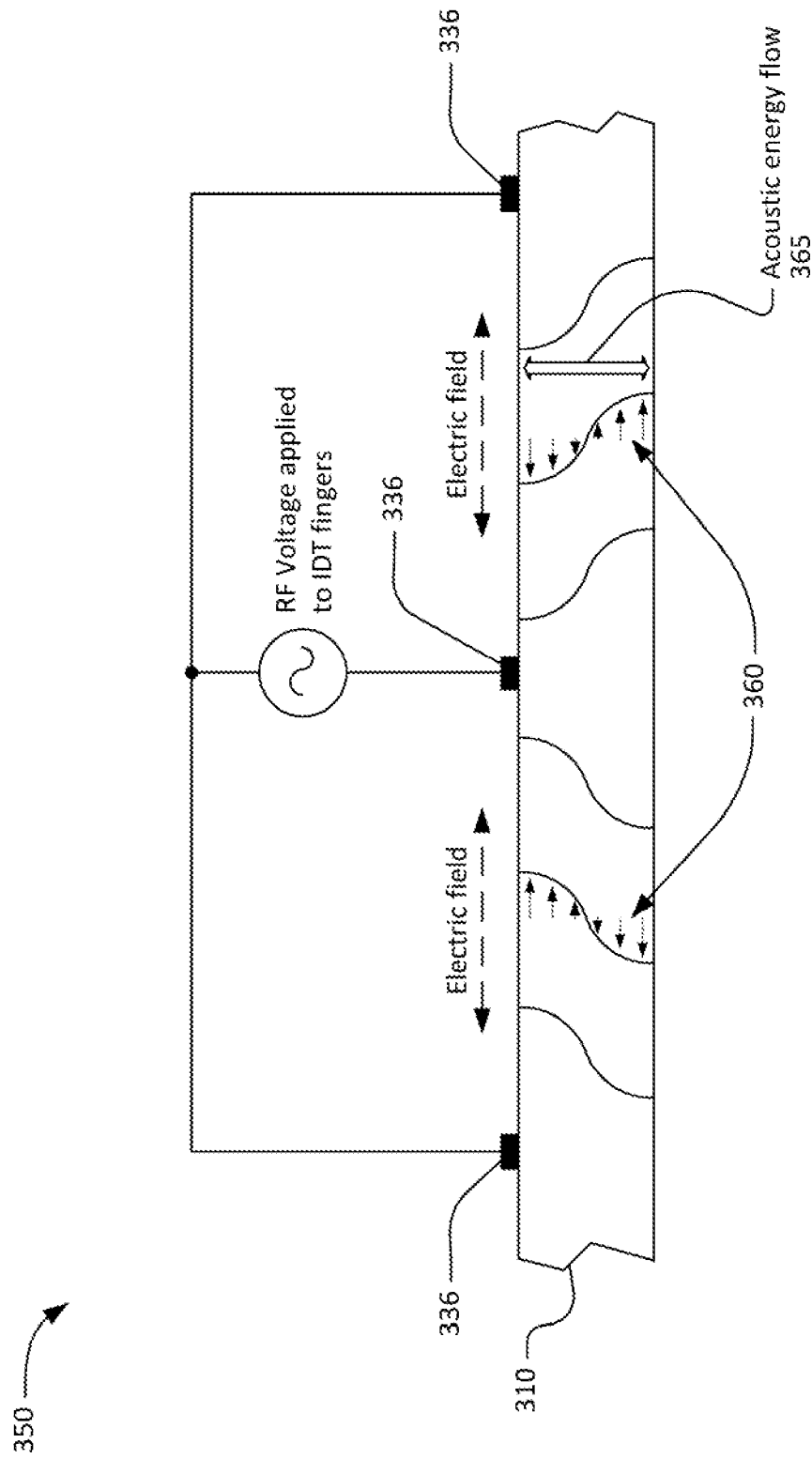
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4A:
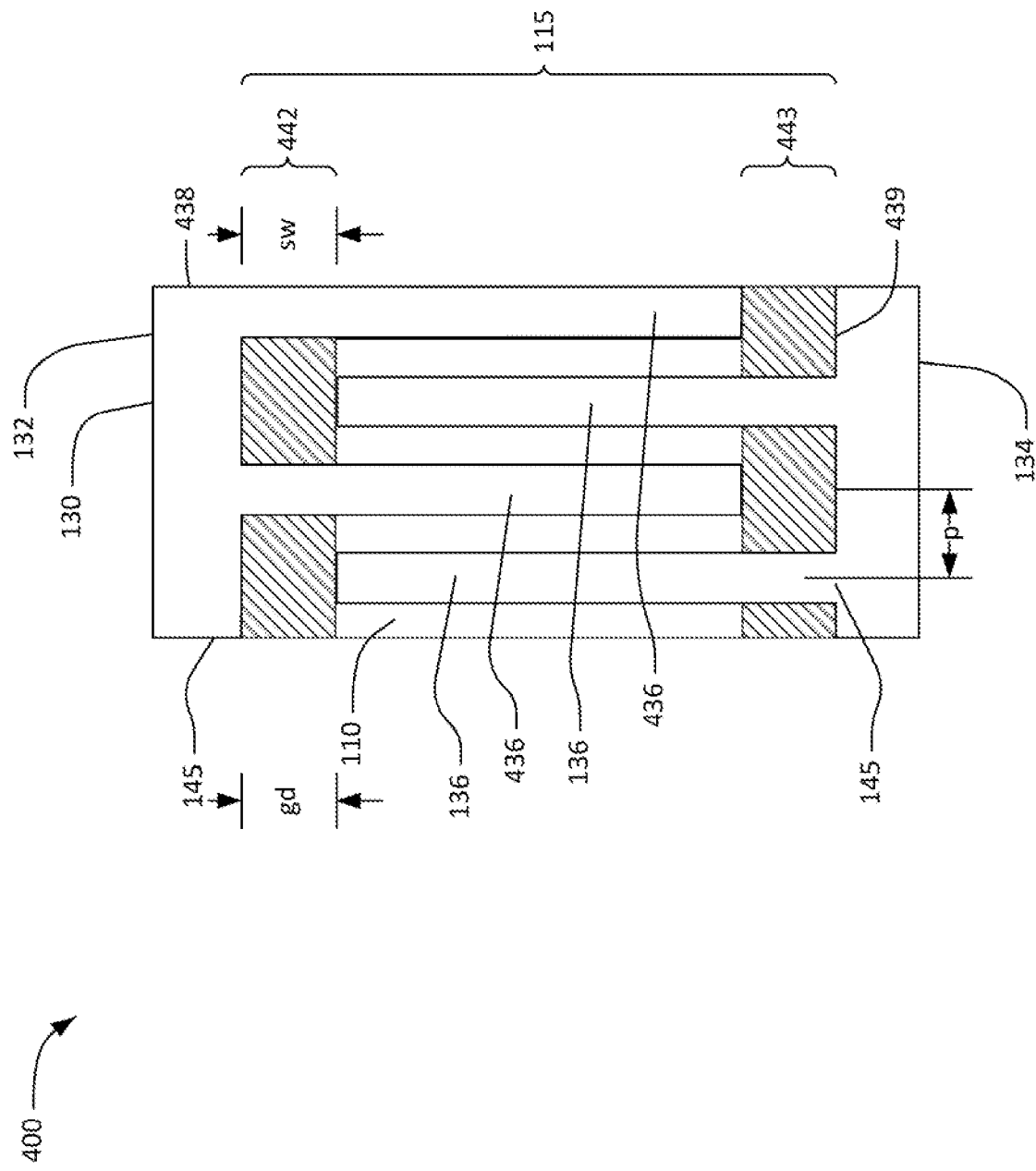
FIG. 4A shows a simplified schematic cross-sectional view of XBARs with gap dielectric stripes in busbar-electrode gaps.

FIG. 4A shows a simplified schematic top view of an XBAR 400 with gap dielectric stripes in busbar-electrode gaps. Device 400 may represent a version of device 100, 300 and/or 350 and having gap dielectric stripes 438 and 439 in busbar-electrode (BE) gaps 442 and 443 between ends of interleaved fingers 136 and opposing busbar 132 and between ends of interleaved fingers 436 and opposing busbar 134, respectively. Device 400 may be a shunt or ground resonators of a filter device having serial resonators as described for FIG. 5.

Dielectric stripes 438 and 439 may be in addition to a frontside dielectric or a passivation layer formed on the plate. Dielectric stripes 438 and 439 may be formed below a frontside dielectric or a passivation layer. Dielectric stripes 438 and 439 may be touching the fingers and the opposing busbars, such that strip width sw is equal to gap distance gd. In other cases, the stripes touch only one of or neither of the fingers or the opposing busbars, such that strip width sw is less than gap distance gd. It is considered that only one stripe may exist in device 400.

Figure 4B:
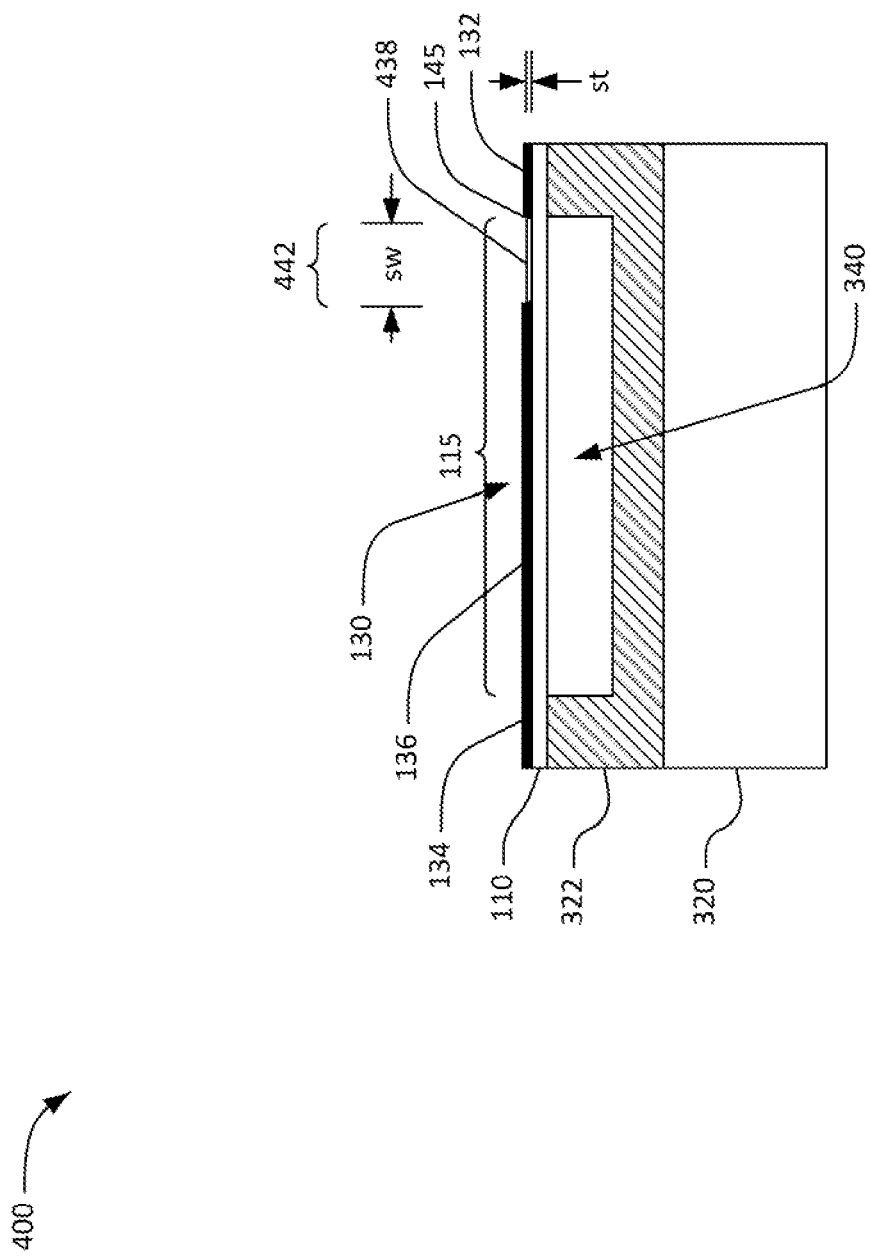
FIG. 4B shows a simplified schematic cross-sectional side view of the XBAR 400 with gap dielectric stripes in busbar-electrode gaps.

FIG. 4B shows a simplified schematic cross-sectional side view of the XBAR 400 with gap dielectric stripes in busbar-electrode gaps. FIG. 4B is from perspective or section B-B as shown in FIG. 1. FIG. 4B does not show stripes 439 to avoid confusion. FIG. 4B shows busbar 134 continuous with or formed of the same metal layer as fingers 136.

Device 400 is part of an acoustic resonator device having a substrate 320 with an intermediary layer 322 having a surface upon which a piezoelectric plate 110 having front and back surfaces has its back surface mounted. For device 400, plate 110 is a rotated Y-cut lithium niobate plate. The back surface of plate 110 attached to the top surface of the intermediary layer 122 except for a portion of the piezoelectric plate forming a diaphragm 115 that spans a 140 cavity in the intermediary layer 122.

An IDT 130 is formed on the front surface of the piezoelectric plate facing away from the cavity 140 such that interleaved fingers 136 and 436 of the IDT are disposed on the diaphragm 115. The overlapping distance of the interleaved fingers defining an aperture of the resonator device. The IDT 130 includes a set of the interleaved fingers 136 attached to and extending from a busbar 134 that opposes a set of the interleaved fingers 436, and a set of the interleaved fingers 436 attached to and extending from a busbar 132 that opposes a set of the interleaved fingers 136 (e.g., such as noted in FIG. 1). During use, the busbars 132 and 134 may be connected to opposing signal connections, or input and output filter connections.

The perimeter 145 of the cavity 140 and diaphragm 115 are defined by the intersection of the cavity and the surface of the intermediary layer 322. Device 400 has an IDT pitch p similar to devices 100, 300 and 350 that is a center-to-center spacing between adjacent ones of the interleaved fingers 136 and 436. A radio frequency signal applied to the IDT 130 of device 400 excites a primary shear acoustic mode in the piezoelectric plate 110 over the cavity 140.

Device 400 may have a gap distance of between 2 and 5 um. The gap distance gd may be from the tip of the finger ends to the nearest surface of the opposing busbar. Gap distance gd may be as described for FIG. 1-2. Gap distance gd may be the pitch p minus a width w of the fingers.

Dielectric stripe 438 includes or is a stripe of dielectric material formed over the plate 110 in a BE gap 442 and over the interleaved fingers 436 in a BE gap 442 between ends of the interleaved fingers 136 and the opposing (e.g., adjacent to the ends of the fingers 436) busbar 132. Dielectric stripe 439 includes or is a stripe of dielectric material formed over the plate 110 in a BE gap 443 and over the interleaved fingers 136 in a BE gap 443 between ends of the interleaved fingers 436 and the opposing busbar 134. In other case, the stripes 438 and 439 may not be formed over the fingers in gaps 442 and 443, respectively. In some cases, the stripes extend partially over the finger ends and/or over the busbars. The stripes 438 and 439 may be rectangular strip shapes of material between flat shaped ends of the interleaved fingers and flat shaped inner surfaces of opposing busbars.

An overlapping distance of the interleaved fingers defines an aperture of the resonator device as shown in FIG. 1. The stripes 438 and 439 reduce acoustic energy leakage from the aperture (e.g., from a resonator or resonating area) in a transverse direction that is parallel to a length of the interleaved fingers. This may be true of one stripe in a single stripe device.

The stripes 438 and 439 have a width sw of between 2 um and 5 um. The stripes 438 and 439 have a thickness st of between 10 um and 50 nm. The dielectric material of the stripes 438 and 439 can be SiO2, Si3N4, or AlN. It can be a combination of layers of these materials. It can be a combination of these materials. Device 400 may have a BE gap distance of 3 um and thickness st of 25 nm thickness.

During use of XBAR 400, a radio frequency signal applied to the IDT 130 (e.g., to busbar 132 and/or 134) excites a primary shear acoustic mode in the piezoelectric plate over the cavity. During use of the resonator, the stripes 438 and 439 lower an amplitude of and a frequency range of output gap mode spurs that appearing immediately above the resonant frequency. The stripes 438 and 439 can be structures for confining acoustic energy within the aperture or membrane (e.g., resonating area) of a rotated Y-cut lithium niobate piezoelectric plate 110. Using the gap dielectric stripes moves problematic 'gap mode' spurs (e.g., gap modes), appearing immediately above the resonant frequency, to a more favorable location in frequency space by lowering the frequency of the 'gap mode' spurs to a frequency of lesser concern for the filter application.

Figure 4C:
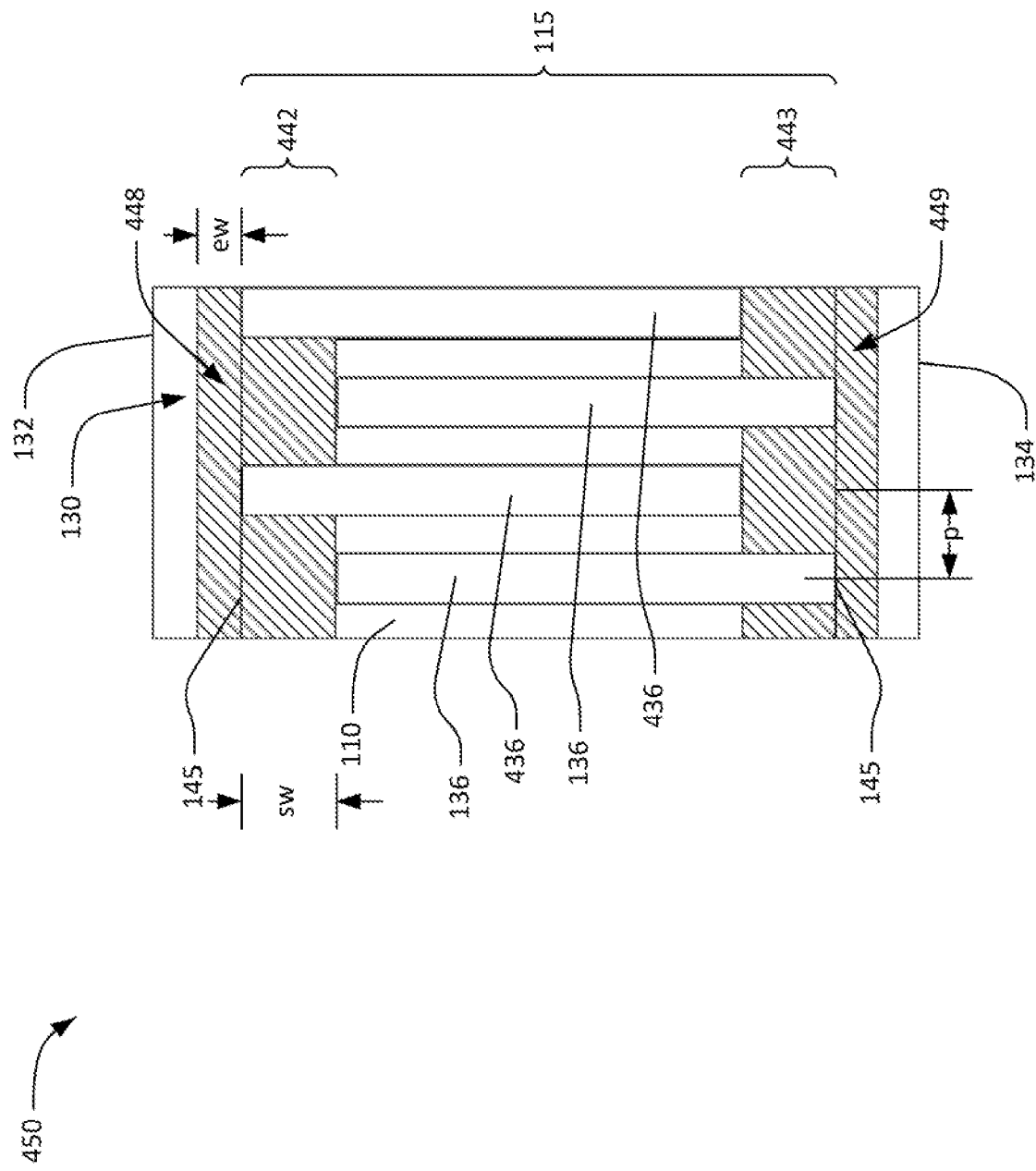
FIG. 4C shows a simplified schematic top view of an XBAR with gap dielectric stripes in busbar-electrode gaps and extending over busbars.

In device 400, the stripes 438 and 439 are located solely within the BE gaps 442 and 443. However, as shown in FIG. 4C, in XBAR 450, the stripes 438 and 439 may extend over a width ew of the busbars 132 and 134. XBAR 450 may be the same as XBAR 400, except for the stripes extending additional width ew over the busbars, in addition to width sw.

Figure 4D:
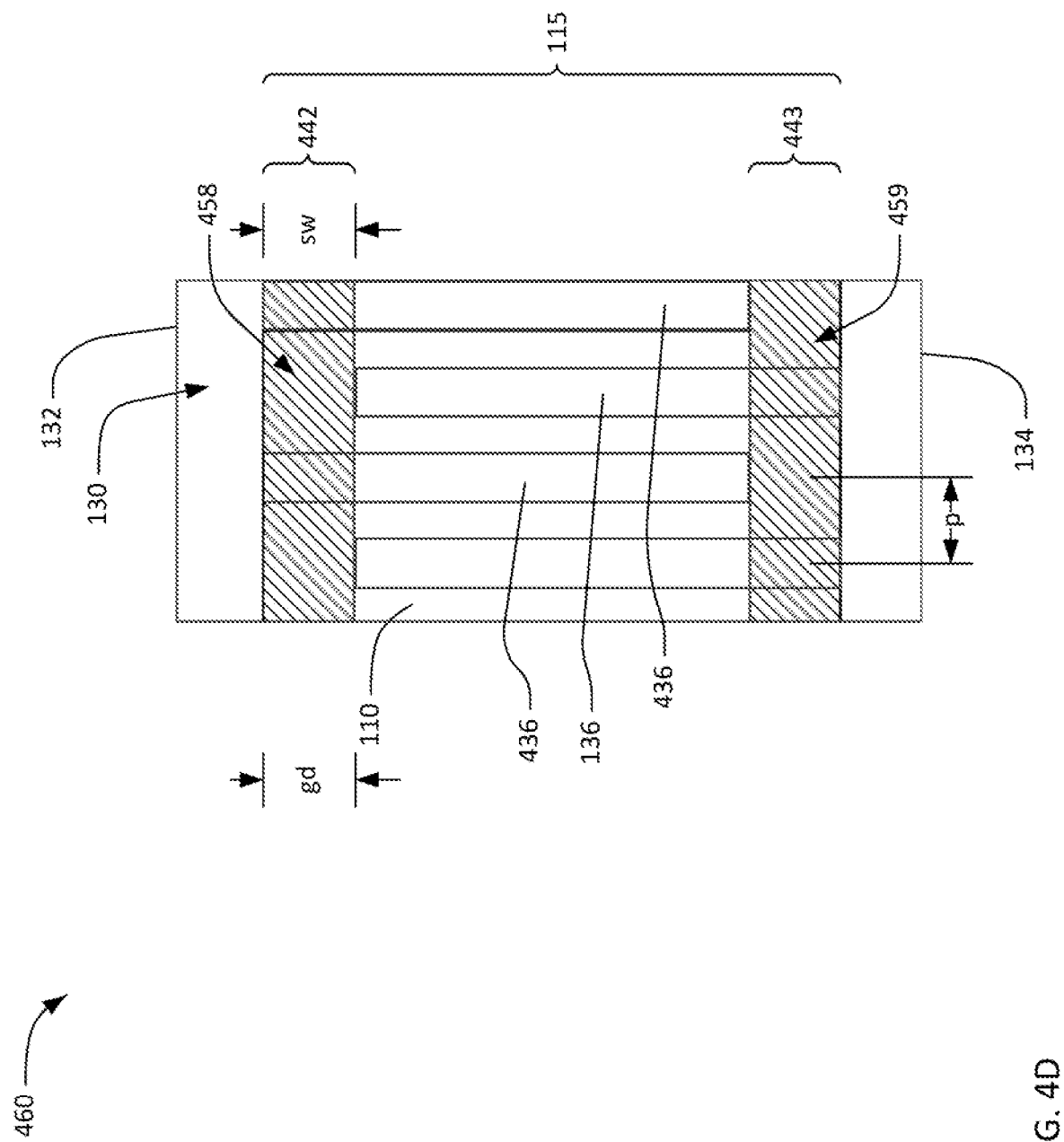
FIG. 4D shows a simplified schematic cross-sectional view of XBARs with gap dielectric stripes in busbar-electrode gaps but not over the fingers.

FIG. 4D shows a simplified schematic top view of an XBAR 460 with gap dielectric stripes in busbar-electrode gaps. Device 460 may represent a version of device 400 having gap dielectric stripes 458 and 459 that do not overlap the fingers in busbar-electrode (BE) gaps 442 and 443 between ends of interleaved fingers 136 and opposing busbar 132 and between ends of interleaved fingers 436 and opposing busbar 134, respectively. Device 460 may be a shunt or ground resonators of a filter device having serial resonators as described for FIG. 5.

Dielectric stripe 458 includes or is a stripe of dielectric material formed over the plate 110 in a BE gap 442 but not over the interleaved fingers 436 in a BE gap 442 between ends of the interleaved fingers 136 and the opposing (e.g., adjacent to the ends of the fingers 436) busbar 132. Dielectric stripe 459 includes or is a stripe of dielectric material formed over the plate 110 in a BE gap 443 but not over the interleaved fingers 136 in a BE gap 443 between ends of the interleaved fingers 436 and the opposing busbar 134.

Figure 4E:
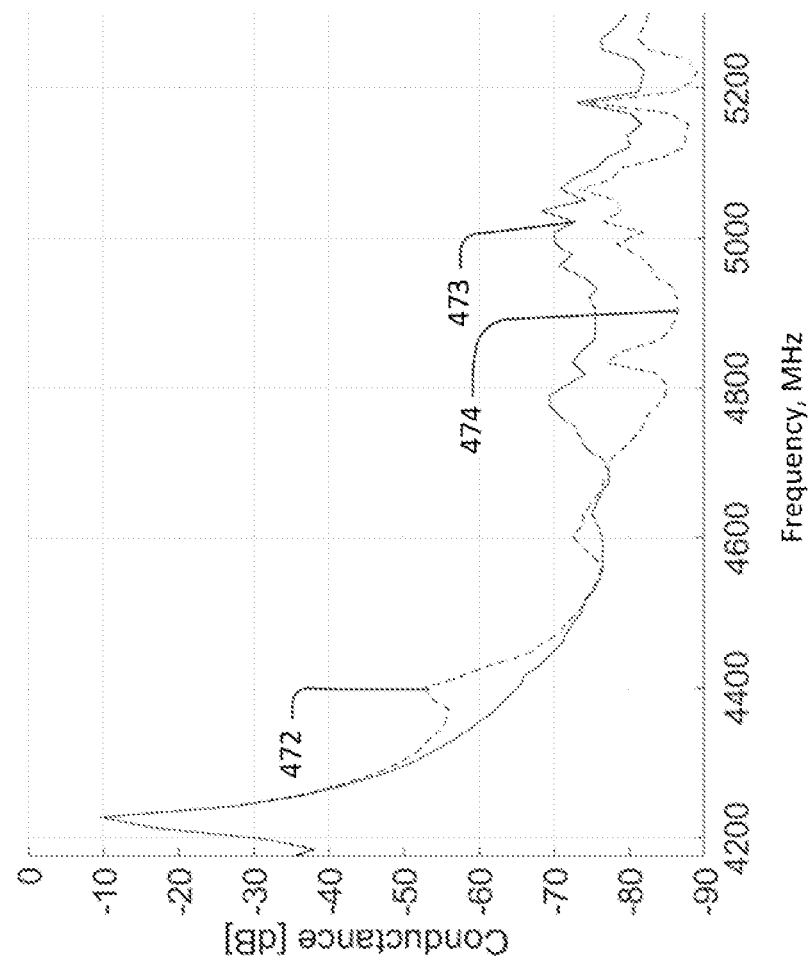
FIG. 4E is a chart of the conductance of the input-output transfer function.

FIG. 4E is a chart 402 of the conductance of the input-output transfer function, of two shunt Y-cut XBAR resonators as functions of frequency. Chart 402 shows the normalized magnitude of conductance (on a logarithmic scale) as a function of frequency for the XBAR devices simulated using finite element method (FEM) simulation techniques. Chart 402 shows a solid line of conductance for an XBAR having a BE gap distance of 1 um, and a dashed line of conductance for an XBAR having a BE gap distance of 3 um.

The two XBARS may be a version of an XBAR having a 362 nm thick, 128-Y cut LiNbO3 plate; a 130 nm SiO2 dielectric coating intermediary layer 322; a pitch p=4.4 um; a mark=0.9 um; and an IDT of 500 nm thick Al electrodes. These Y-cut XBAR resonators suffer two deleterious effects due to '3D' effects relating to the finite aperture of the devices. First, they suffer a conspicuous set of 'gap mode' spurs, appearing immediately above the resonant frequency such as at 472. Second, at 473 they suffer a broad-band loss appearing above the anti-resonance frequency. For example, feature 472 may sit at an n79 lower band edge, while feature 473 may sit at the n79 upper band edge.

By tuning the BE gap between 1 um and 3 um, one of feature 472 or 473 can be minimized at the expense of the other. Notably, the BE gap of 3 um resonator has a spur and 472 but has less spurs at 473. However, if both features 472 and 473 lie at undesirable frequencies for a filter application, optimization becomes complex because one feature gets worse while making the other better. Thus, a better solution than this tradeoff may be desired.

A solution is to use the XBAR with gap dielectric stripes in busbar-electrode gaps as noted herein. This way, the BE gap distance gd can be tuned (e.g., increased from 1 um) to the 3 um larger gap to reduce the loss at 473; and the stripes 438 and 439 can be used (e.g., added to the XBAR) to move away from and/or reduce the spurs at 472. Using the gap dielectric stripes (as compared to not having them) may move problematic 'gap mode' spurs (e.g., gap modes) at 472, appearing immediately above the resonant frequency, to a more favorable location in frequency space by lowering the frequency of the 'gap mode' spurs to a frequency of lesser concern for the filter application.

In one example, the stripes are gap oxide strips located solely within the BE gaps of the IDT so as to influence only the problematic 'gap mode' spurs at 472. This influencing may be lowering the frequency of the 'gap mode' spurs so they are engineered to a frequency of lesser concern for the filter application. This allows the use of a larger BE gap, such as gd=3 um, to minimize losses in region 473, which improves overall filter performance.

Figure 4F:
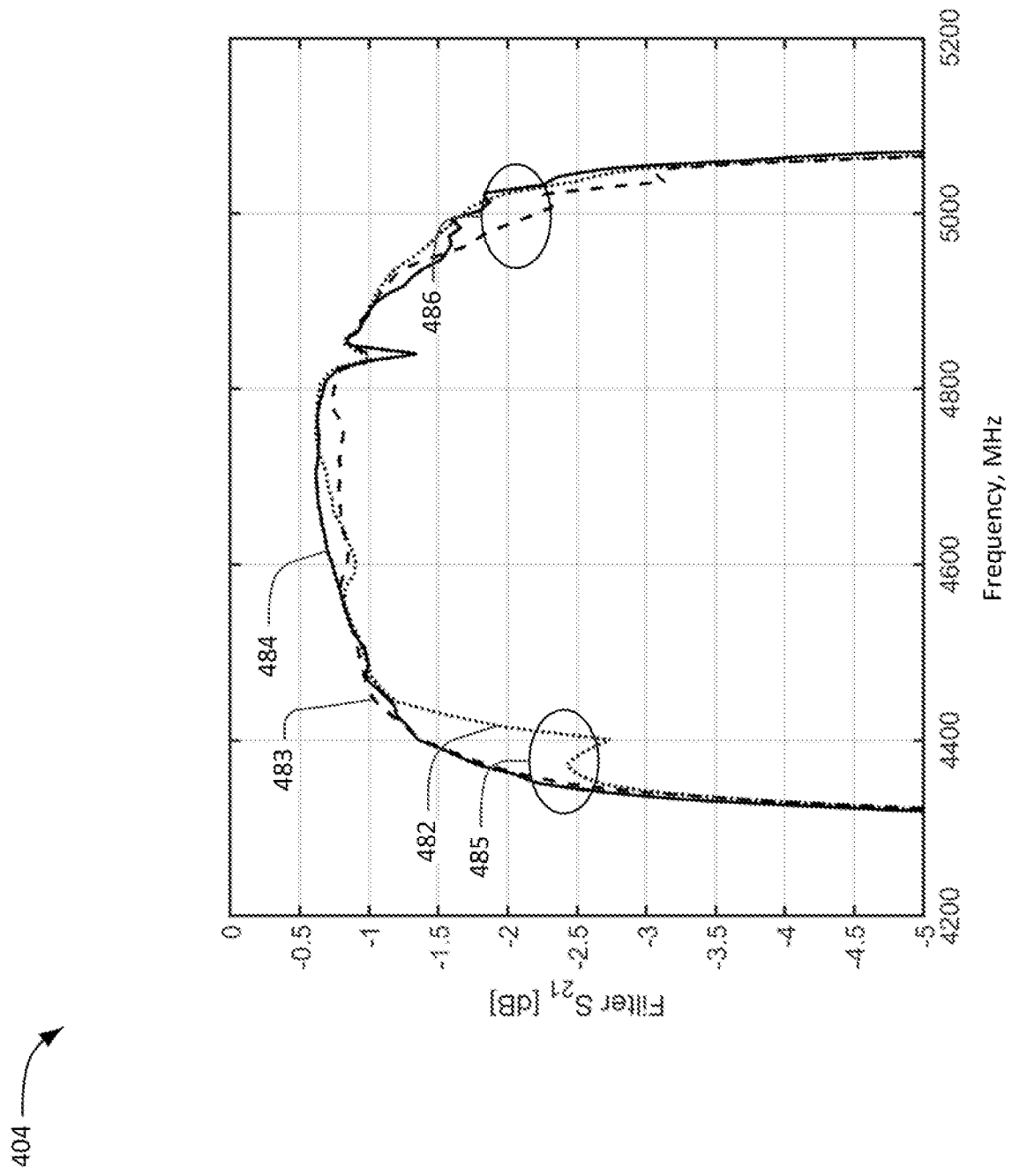
FIG. 4F is a chart of the magnitude of S21 of three 6-XBAR resonator filter devices as functions of frequency.

FIG. 4F is a chart 404 of the magnitude of S21, in dB, of three 6-XBAR resonator filter devices as functions of frequency. Chart 404 shows the normalized magnitude of the S21 (on a logarithmic scale) as a function of frequency for three XBAR filter devices, such as a version of filter 500, simulated using FEM simulation techniques. The dotted line 482 is a plot of S21 for the XBAR of chart 404 having gd=1 um. The dashed line 483 is a plot of S21 for the XBAR of chart 404 having gd=3 um. Line 482 has a loss at lower band edge 485 and line 483 has a loss at upper band edge 486. Thus, lines 482 and 483 show a lower band edge 485 and upper band edge 486 performance trade and no adequate solution is found.

However, solid line 484 is for a version of the shunt XBAR of graph 402 with gap distance gd=3 um, and with gap dielectric stripes in busbar-electrode gaps as noted herein. In this case, the stripe widths are sw=3 um and the thicknesses st is 25 nm, although other widths and thickness may also be used. Line 484 shows that S21 at the lower band edge 485 is preserved as well as at the upper band edge 486. Consequently, the BE gap distance gd is tuned to the 3 um larger gap and the stripes (e.g., 438 and 439) are used to move the problematic 'gap mode' spurs, to a more favorable location in frequency space by lowering the frequency of the 'gap mode' spurs.

Figure 4G:
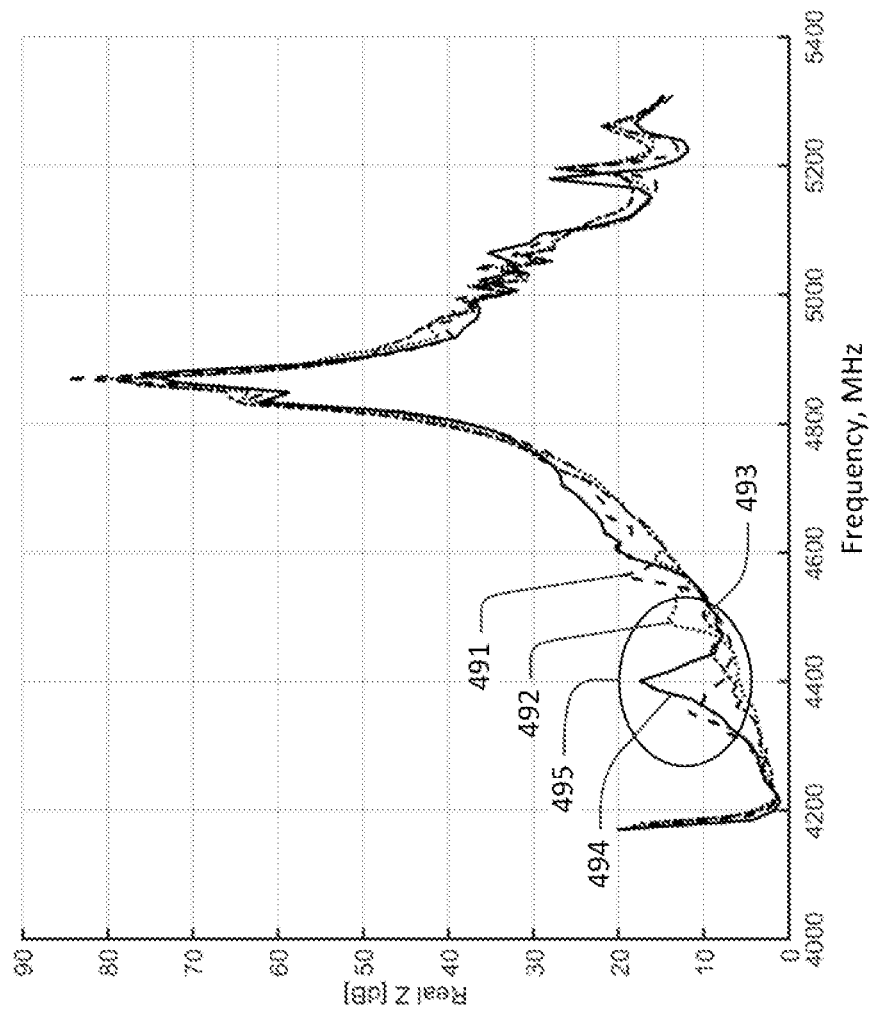
FIG. 4G is a chart of the Real Z S21 of four XBAR resonators as functions of frequency.

FIG. 4G is a chart 406 of the Real Z, in dB, S21 of four XBAR resonators as functions of frequency. Chart 406 shows the normalized magnitude of the Real Z S21 (on a logarithmic scale) as a function of frequency for four XBARs, such as a version of XBAR 400 or 450, simulated using FEM simulation techniques. The, dashed lines 491, dotted lines 492, dash-dotted lines 493 and solid lines 494 are for four versions of the shunt XBAR of graph 402 with gap distance gd=3 um, and with gap dielectric stripes in busbar-electrode gaps as noted herein. In this case, the thicknesses st are 0 (No stripe), 5 nm for dashed line 491, 15 nm for dotted line 492 and 25 nm for dash-dotted line 491 and zero nm solid line 494; although other widths and thickness may also be used.

At a resonator level, the individual 'gap mode' spurs near the sensitive 4400 MHz frequency range at oval 495 are a function of the stripe thickness st. As thickness st increases, the critical spurs are advantageously moved down in frequency and are diminished in amplitude. In this example, little residual loss remains in the sensitive region 495 by a thickness st of 25 nm, which is a desirable improvement as compared to no stripes or the thinner stripes.

Thus, using the gap dielectric stripes in busbar-electrode gaps may serve two primary purposes: 1) to remove gap mode spurs by moving them lower in frequency and (potentially) reducing their magnitude; and 2) to improve acoustic confinement and limit energy leakage to the busbar region, improving device Q.

Figure 5:
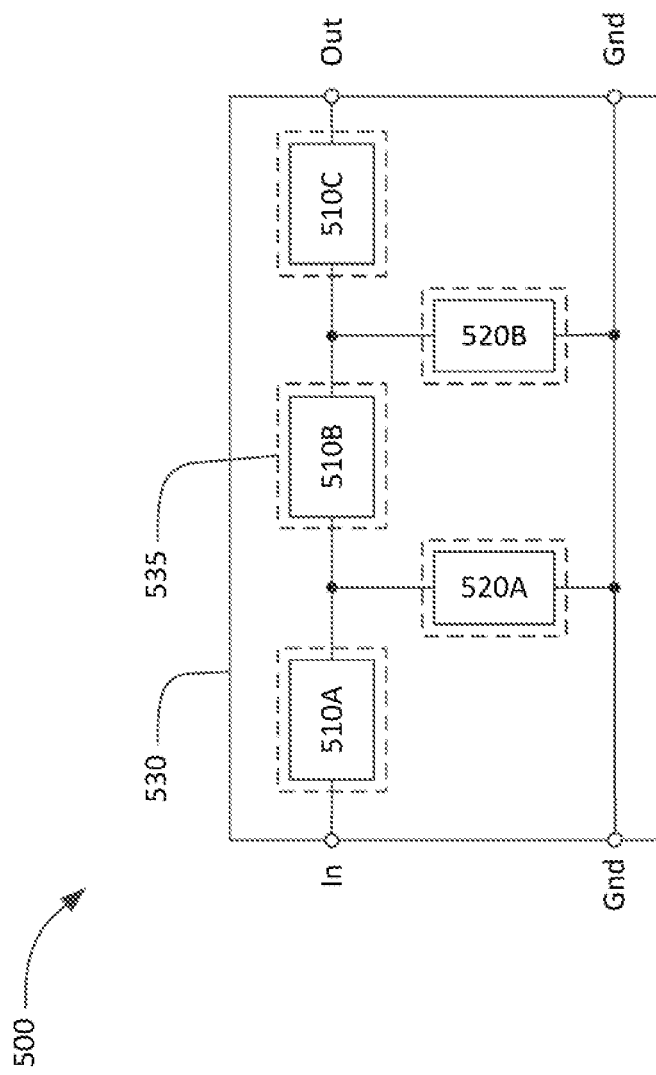
FIG. 5 is a schematic block diagram of a filter using XBARs.

FIG. 5 is a schematic circuit diagram and layout for a high frequency band-pass filter 500 using XBARs where the two connections to an XBAR that are shown are connections to the two busbars of the XBAR. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). Any number of the resonators of filter 500 may be a XBAR 400 or 450; a version of XBAR 400 or 450; and/or a version of device 100, 300 or 350 and with stripes of a dielectric material formed over the plate in gaps between ends of the interleaved fingers and opposing busbars of the IDT. In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Description of Methods

Figure 6:
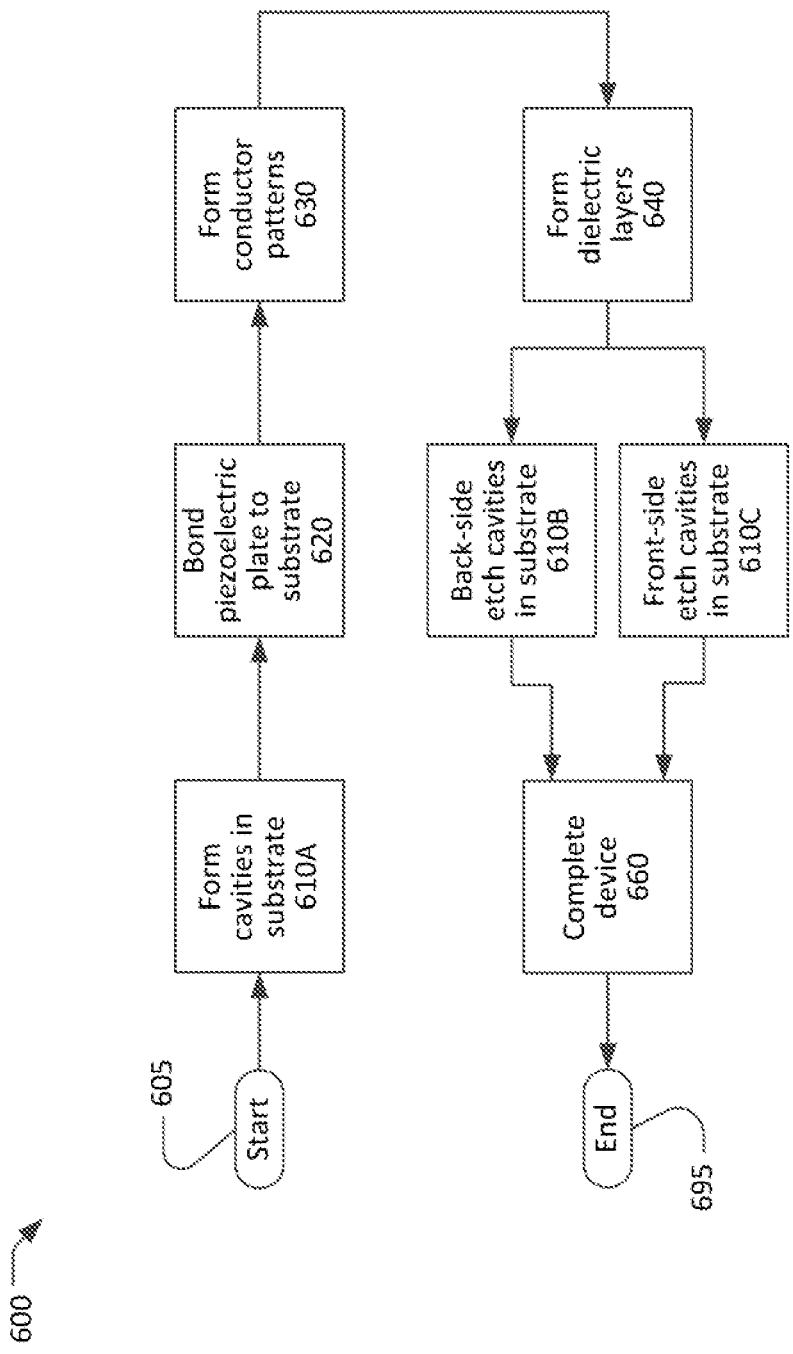
FIG. 6 is a flow chart of a process for fabricating an XBAR with gap dielectric stripes in busbar-electrode gaps.

FIG. 6A is a simplified flow chart showing a process 600 for making an XBAR or a filter incorporating XBARs. The process 600 may form an XBAR, a variation of an XBAR or an example of an XBAR as noted herein. The process 600 starts at 605 with a substrate and a plate of piezoelectric material and ends at 695 with a completed XBAR or filter. As will be described subsequently, the piezoelectric plate may be mounted on a sacrificial substrate or may be a portion of wafer of piezoelectric material. The flow chart of FIG. 6A includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6A.

The flow chart of FIG. 6A captures three variations of the process 600 for making an XBAR which differ in when and how cavities are formed in the substrate. The cavities may be formed at steps 610A, 610B, or 610C. Only one of these steps is performed in each of the three variations of the process 600.

The piezoelectric plate may be, for example, Z-cut, rotated Z-cut, or rotated Y-cut lithium niobate or lithium tantalate. In some cases, it is Y-cut or rotated Y-cut lithium niobate. The piezoelectric plate may be some other material and/or some other cut. The substrate may be silicon. The substrate or an intermediary layer of the substrate may be some material that allows formation of deep cavities by etching or other processing. The silicon substrate may have layers of silicon TOX and polycrystalline silicon.

In one variation of the process 600, at 610A one or more cavities are formed in the substrate 120 or 320; or an intermediary layer of the substrate, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate or layer 322, and the resulting resonator devices will have a cross-section as shown in FIG. 3A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 620, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate).The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6A). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDT's are formed prior to bonding the plate to the substrate.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate or top layer 322 may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 610C will not penetrate completely through the substrate top layer 322, and the resulting resonator devices will have a cross-section as shown in FIG. 3A.

In all variations of the process 600, the filter or XBAR device is completed at 660. Actions that may occur at 660 include depositing an encapsulation/passivation layer such as SiO$_2$ or Si$_3$O$_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695. FIGS. 1-4C may show examples of the fingers of selected IDTs after completion at 660.

Process 600 may be or include fabricating an XBAR with gap dielectric stripes in busbar-electrode gaps. For example, step 640 and/or step 660 may include the formation of gap dielectric stripes in busbar-electrode gaps as noted herein. At 640 the stripes may be formed before formation of a front-side dielectric. At 660 the stripes may be formed before formation of a passivation layer. The stripes may be formed after formation and on top of a front-side dielectric layer and prior to formation of a passivation layer. Forming the stripes may include forming stripes of a dielectric material over the plate 110 in gaps between the ends of the interleaved fingers and the opposing busbars (e.g., adjacent to the ends) of the IDT. Forming the stripes may include selecting a width sw and thickness st of the strips to reduce acoustic energy leakage from the aperture in the transverse direction that is parallel to a length of the interleaved fingers. Selecting the width sw may be similar to selecting gap distance gd, such as when the strips cover the entire gap distance gd.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. An acoustic resonator device comprising:
   a substrate having a surface;
   a piezoelectric layer attached to the surface of the substrate with an intermediate layer therebetween, the piezoelectric layer including a diaphragm that is over a cavity in the intermediate layer;
   an interdigital transducer (IDT) on a surface of the piezoelectric layer and having first and second busbars with interleaved fingers that extend from the first and second busbars and that are on the diaphragm; and
   a plurality of stripes of a dielectric material over the piezoelectric layer,
   wherein at least one stripe of the plurality of stripes of dielectric material extends in a direction substantially parallel to the first busbar and in a gap that extends contiguously without any intervening items between the first busbar and ends of the interleaved fingers extending from the second busbar of the IDT,
   wherein the at least one stripe of the dielectric material has a width that is between 2 μm and 5 μm, and a thickness that is between 10 nm and 50 nm, and
   wherein the dielectric material is one of a silicon oxide, a silicon nitride and an aluminum nitride.

2. The acoustic resonator device of claim 1, wherein a first plurality of the interleaved fingers is attached to the first busbar that opposes a second plurality of the interleaved fingers; and wherein the second plurality of the interleaved fingers is attached to the second busbar that opposes the first plurality of the interleaved fingers.

3. The acoustic resonator device of claim 2, wherein the plurality of stripes include:
   a first stripe of the dielectric material over the piezoelectric layer and in a first gap between ends of the first plurality of the interleaved fingers and the second busbar, the first stripe of the dielectric material not disposed over the second plurality of the interleaved fingers, and
   a second stripe of the dielectric material over the piezoelectric layer and in a second gap between ends of the second plurality of the interleaved fingers and the first busbar, the second stripe of the dielectric material not disposed over the first plurality of the interleaved fingers.

4. The acoustic resonator device of claim 2, wherein an overlapping distance of the interleaved fingers in a transverse direction defines an aperture of the acoustic resonator device, and wherein the plurality of stripes are configured to reduce acoustic energy leakage from the aperture in the transverse direction that is parallel to a length of the interleaved fingers.

5. The acoustic resonator device of claim 1, wherein the plurality of stripes are each rectangular strip shapes between flat shaped ends of the interleaved fingers and flat shaped inner surfaces of the first and second busbars.

6. The acoustic resonator device of claim 1, wherein a radio frequency signal applied to the IDT excites a primary shear acoustic mode in the diaphragm over the cavity, the primary shear acoustic mode being a bulk shear mode where acoustic energy propagates along a direction substantially orthogonal to a surface of the piezoelectric layer, which is transverse to a direction of electric field created by the interleaved fingers of the IDT that is predominantly lateral to the surface of the piezoelectric layer.

7. The acoustic resonator device of claim 1, wherein the piezoelectric layer is a rotated Y-cut lithium niobate piezoelectric layer and the acoustic resonator device is a shunt resonator of a ladder filter.

8. The acoustic resonator device of claim 7, wherein the plurality of stripes are configured to lower an amplitude of and a frequency range of output gap mode spurs appearing immediately above the resonant frequency of the resonator.

9. The acoustic resonator device of claim 1, wherein the plurality of stripes of the dielectric material are either located solely within a busbar-electrode gap or also extending over a width of at least one of the first and second busbars.

10. The acoustic resonator device of claim 1, wherein the width of the at least one stripe is measured in a direction substantially perpendicular to a direction in which the first and second busbars extend, and the thickness of the at least one stripe is measured in a direction substantially orthogonal to the surface of the substrate.

11. The acoustic resonator device of claim 1, further comprising a back-side dielectric layer that is disposed on a surface of the piezoelectric layer that is opposite the surface of the piezoelectric layer on which the IDT is disposed.

12. An acoustic resonator device comprising:
   a substrate having a surface;
   a piezoelectric layer attached to the surface of the substrate with an intermediate layer therebetween, the piezoelectric layer including a diaphragm that is over a cavity in the intermediate layer;
   a conductor pattern including an interdigital transducer (IDT) on a surface of the piezoelectric layer and having first and second busbars with interleaved fingers on the diaphragm, wherein the IDT includes a first set of the interleaved fingers attached to and extending from the first busbar, and a second set of the interleaved fingers attached to and extending from the second busbar; and
   a plurality of stripes of a dielectric material over the piezoelectric layer and that extend in a direction substantially parallel to the first and second busbars and that are in gaps extending contiguously without any intervening items between:
      ends of the first set of interleaved fingers and an inner surface of the second busbar that faces the first busbar, and
      ends of the second set of interleaved fingers and an inner surface of the first busbar that faces the second busbar,
   wherein at least one stripe of the plurality of stripes of dielectric material has a width that is between 2 µm and 5 µm, and a thickness that is between 10 nm and 50 nm, and
   wherein the dielectric material is one of a silicon oxide, a silicon nitride and an aluminum nitride.

13. The acoustic resonator device of claim 12, wherein the plurality of stripes include:
   a first stripe of the dielectric material over the piezoelectric layer and in the gap between ends of the first set of interleaved fingers and the second busbar, the first stripe of the dielectric material not disposed over the second plurality of the interleaved fingers; and
   a second stripe of the dielectric material formed over the piezoelectric layer and in the gap between ends of the set of second interleaved fingers and the first busbar, the second stripe of the dielectric material not disposed over the first plurality of the interleaved fingers.

14. The acoustic resonator device of claim 12, wherein an overlapping distance of the interleaved fingers in a transverse direction defines an aperture of the acoustic resonator device, and wherein the plurality of stripes are configured to reduce acoustic energy leakage from the aperture in the transverse direction that is parallel to a length of the interleaved fingers.

15. The acoustic resonator device of claim 12, wherein the plurality of stripes are each rectangular strip shapes between flat shaped ends of the interleaved fingers and flat shaped inner surfaces of the first and second busbars.

16. The acoustic resonator device of claim 12, wherein a radio frequency signal applied to the IDT excites a primary shear acoustic mode in the piezoelectric layer over the cavity, and wherein the cavity is formed in the intermediate layer of the substrate, the primary shear acoustic mode being a bulk shear mode where acoustic energy propagates along a direction substantially orthogonal to a surface of the piezoelectric layer, which is transverse to a direction of electric field created by the interleaved fingers of the IDT that is predominantly lateral to the surface of the piezoelectric layer.

17. The acoustic resonator device of claim 12, further comprising a back-side dielectric layer that is disposed on a surface of the piezoelectric layer that is opposite the surface of the piezoelectric layer on which the IDT is disposed.

18. A filter device comprising:
   a plurality of bulk acoustic resonators, with at least one of the bulk acoustic resonators comprising:
      a substrate having a surface;
      a piezoelectric layer attached to the surface of the substrate with an intermediate layer therebetween, the piezoelectric layer including a diaphragm that is over a cavity in the intermediate layer;

an interdigital transducer (IDT) on a surface of the piezoelectric layer and having first and second busbars with interleaved fingers that extend from the first and second busbars, respectively, and that are on the diaphragm; and a plurality of stripes of a dielectric material over the piezoelectric layer and in gaps that extend contiguously without any intervening items between ends of the interleaved fingers and the first and second busbars of the IDT, wherein the plurality of stripes of dielectric material each extend in a direction substantially parallel to the first and second busbar, and wherein at least one stripe of the plurality of stripes of dielectric material has a width that is between 2 µm and 5 µm, and a thickness that is between 10 nm and 50 nm.

19. The filter device of claim 18, wherein, for the at least one bulk acoustic resonator:

a first plurality of the interleaved fingers is attached to the first busbar that opposes a second plurality of the interleaved fingers, the second plurality of the interleaved fingers is attached to the second busbar that opposes the first plurality of the interleaved fingers, and the plurality of stripes include:

a first stripe of the dielectric material over the piezoelectric layer and in a first gap between ends of the first plurality of the interleaved fingers and the second busbar, the first stripe of the dielectric material not disposed over the second plurality of the interleaved fingers, and a second stripe of the dielectric material over the piezoelectric layer and in a second gap between ends of the second plurality of the interleaved fingers and the first busbar, the second stripe of the dielectric material not disposed over the first plurality of the interleaved fingers.

20. The filter device of claim 18, wherein a radio frequency signal applied to the IDT of each of the plurality of bulk acoustic resonators excites a primary shear acoustic mode in the respective diaphragm, the primary shear acoustic mode being a bulk shear mode where acoustic energy propagates along a direction substantially orthogonal to a surface of the piezoelectric layer, which is transverse to a direction of electric field created by the interleaved fingers of the IDT that is predominantly lateral to the surface of the piezoelectric layer.

* * * * *